United States Patent
Li

(10) Patent No.: US 7,586,258 B2
(45) Date of Patent: Sep. 8, 2009

(54) ORGANIC LIGHT EMITTING DIODE AND ORGANIC ELECTROLUMINESCENT DEVICE USING THE SAME

(75) Inventor: Shi-Hao Li, Panchiao (TW)

(73) Assignee: AU Optronics Corp., Hsinchu (TW)

( * ) Notice: Subject to any disclaimer, the term of this patent is extended or adjusted under 35 U.S.C. 154(b) by 405 days.

(21) Appl. No.: 11/481,893

(22) Filed: Jul. 7, 2006

(65) Prior Publication Data

US 2007/0170841 A1     Jul. 26, 2007

(30) Foreign Application Priority Data

Jan. 20, 2006   (TW) .............................. 95102317 A

(51) Int. Cl.
*H01L 51/00* (2006.01)
(52) U.S. Cl. ...................... 313/506; 313/504
(58) Field of Classification Search ................ 313/504, 313/506; 257/79, 80
See application file for complete search history.

(56) References Cited

U.S. PATENT DOCUMENTS

2003/0038593 A1 * 2/2003 Aziz et al. .................. 313/506
2005/0051776 A1 * 3/2005 Miyagi et al. ................. 257/72
2005/0253508 A1 * 11/2005 Okano ......................... 313/506
2006/0243989 A1 * 11/2006 Yamazaki et al. ............. 257/79

* cited by examiner

*Primary Examiner*—Karabi Guharay
(74) *Attorney, Agent, or Firm*—Birch, Stewart, Kolasch & Birch, LLP

(57) ABSTRACT

An organic light emitting diode comprises a transparent electrode, an organic emission layer, an anti-reflective electrode and an auxiliary electrode. The organic emission layer is disposed between the transparent electrode and the anti-reflective electrode. The anti-reflective electrode includes a first conductive layer, a second conductive layer, and a non-metal layer. The first conductive layer is disposed between the organic emission layer and the non-metal layer. The non-metal layer is interposed between the first conductive layer and the second conductive layer. The auxiliary electrode penetrates the non-metal layer to connect the first conductive layer with the second conductive layer. The organic light emitting diode can be applied to an organic electroluminescent device.

13 Claims, 3 Drawing Sheets

ORGANIC LIGHT EMITTING DIODE AND ORGANIC ELECTROLUMINESCENT DEVICE USING THE SAME

This application claims the benefit of Taiwan Patent Application Serial No. 095102317, filed Jan. 20, 2006, the subject matter of which is incorporated herein by reference.

BACKGROUND OF THE INVENTION (1) Field of the Invention

The present invention relates to an organic light emitting diode and an organic electroluminescent device which uses the organic light emitting diode and features low resistance.

(2) Description of the Related Art

Organic light emitting diodes are served as light source of the flat display due to the characteristics of low operation voltage and high luminescence efficiency. The organic light emitting diode includes multiplicity stacking organic layers disposed between two electrodes. For applied in single-side-visible displays, the organic light emitting diode has a reflective electrode and a transparent electrode. The reflective electrode is made from metal materials with low work function to be a cathode for electron injecting. The reflective electrode can improve the brightness due to reflecting light toward the transparent electrode.

However, the ambient light, which travels into the organic light emitting diode, is reflected by the reflective electrode, so as to reduce the contrast ratio of the flat display. In the light-room or under the sunlight, the contrast ratio has more influence on image quality than the luminance. Therefore, the producers hope to reduce the reflectivity of the ambient light in the display to increase the contrast ratio.

One way to improve contrast ratio is to adhere an anti-reflective film to the outer surface of the flat display. This way must add an adhering step and increase cost in the process of manufacturing the organic light emitting diode.

Another way to improve the contrast ratio is to employ an electrode with characteristics of anti-reflectance or light-absorbance, i.e. black cathode or black anode. The black cathode or anode has multiplicity films such as Al (1 nm)/metal oxide film or semiconductor film/Al (100 nm) to form the phase difference of ¼ wavelength. However, the middle layers such as metal oxide films or semiconductor films are not perfectly electric conductors. Their higher energy gap hinders flow of electrons or holes. When the panels have larger size, the higher electric resistance or the unstable electric current happens. That results in heat effect, so the temperature of the panel increases.

SUMMARY OF THE INVENTION

The object of the present invention is to provide an organic light emitting diode featuring low reflectivity, low resistance, and aiding in flow of electric current.

In one aspect of the present invention, the organic light emitting diode comprises a transparent electrode, an organic emission layer, an anti-reflective electrode and an auxiliary electrode. The organic emission layer is disposed between the transparent electrode and the anti-reflective electrode, and is made of small molecular organic materials or poly molecular organic materials. The anti-reflective electrode includes a first conductive layer, a second conductive layer, and a non-metal layer. The first conductive layer is disposed between the organic emission layer and the non-metal layer. The non-metal layer is interposed between the first conductive layer and the second conductive layer. The auxiliary electrode penetrates the non-metal layer to electrically connect the first conductive layer with the second conductive layer.

The auxiliary electrode can be constructed by stacking a plurality of sub-layers. Preferably, it is larger than 1000 Å and smaller than 30,000 Å in height, and tapers from bottom to top. A sidewall of the auxiliary electrode cooperates with the bottom plane of that to define an included angle ranging from 60 degree to 90 degree.

The organic light emitting diode employs the anti-reflective electrode to reduce the reflectivity, and uses the auxiliary electrode to aid in electric current flowing into the anti-reflective electrode. Note that the organic light emitting diode of the present invention creates lower entire resistance and lower loading effect than the prior art when applied to large-size panels. The modification in the present invention is independent of transistors, so it can applied to the active or passive displays.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
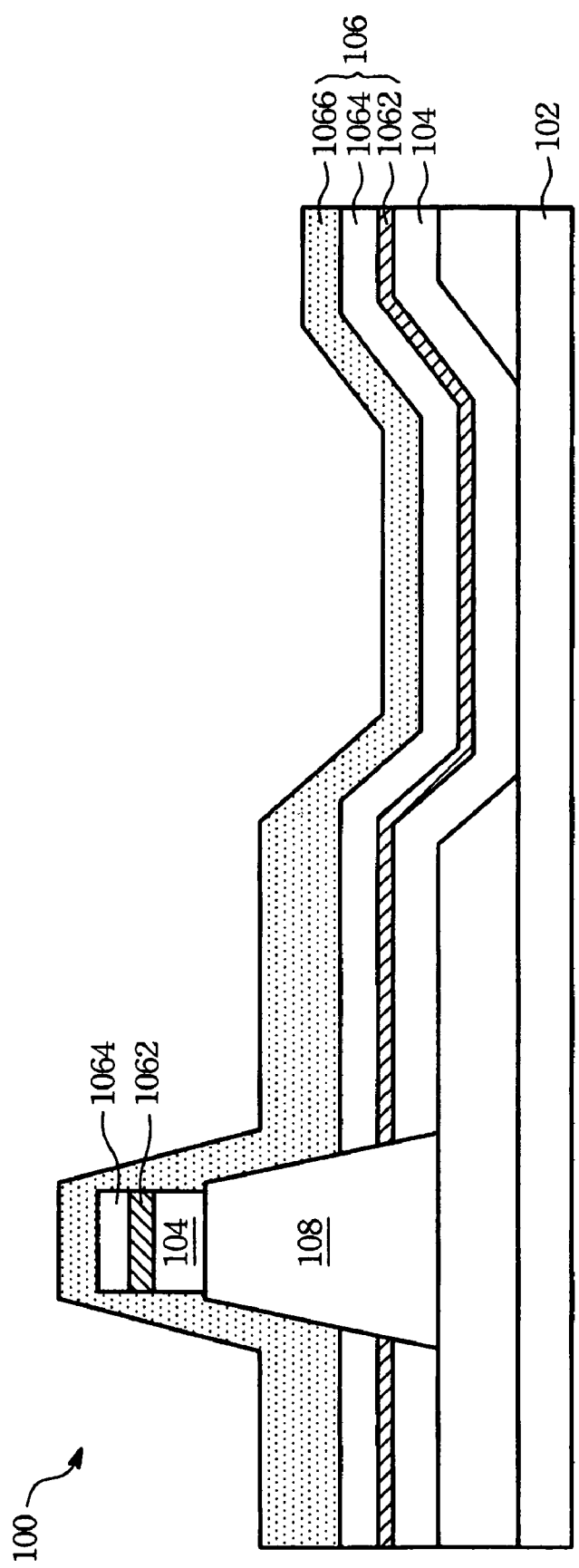
FIG. 1 is an organic light emitting diode according to the present invention.

Refer to FIG. 1, the organic light emitting diode 100 includes a transparent electrode 102, a organic emission layer 104 and an anti-reflective electrode 106. The organic emission layer 104 is disposed between the transparent electrode 102 and the anti-reflective electrode 106, and is made of small molecular organic materials or poly molecular organic materials.

The anti-reflective electrode 106 is disposed on the organic emission layer and includes a first conductive layer 1062, a second conductive layer 1066 and a non-metal layer 1064. The non-metal layer 1064 is disposed between the first conductive layer 1062 and the second conductive layer 1064. The first conductive layer 1062 is disposed between the organic emission layer 104 and the non-metal layer 1064, or contacts with the organic emission layer 104. Specially, an auxiliary electrode 108 is provided to penetrate the non-metal layer 1064 to electrically connect the first conductive layer 1062 to the second conductive layer 1066. The non-metal layer 1064 can be a semiconductor layer or a metal oxide layer. The second conductive layer 1066 can be a metal layer. The first conductive layer 1062 can be a metal layer with preferable thickness ranging from 100 Å to 200 Å. The thickness of the second conductive layer 1066 is increased to be larger than the thickness of the first conductive layer 1062, so the electric resistance of the anti-reflective electrode 106 is reduced and the anti-reflective ability of that are maintained.

Figure 2:
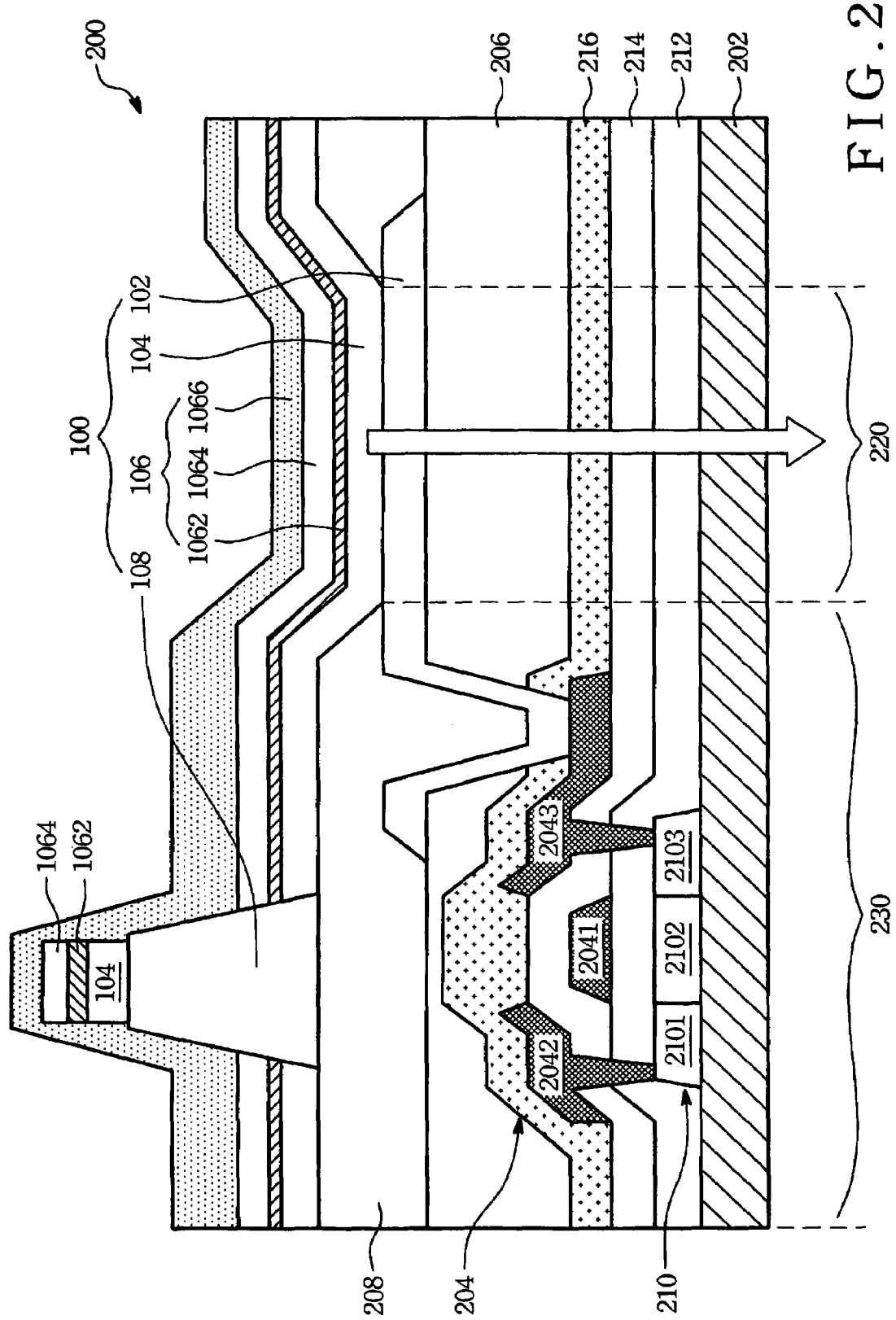
FIG. 2 is an organic electroluminescent device according to the present invention.

Refer to FIG. 2, the organic electroluminescent device 200 includes a transistor 204 and the organic light emitting diode 100 disposed on a transparent substrate 202. The transistor 204 is electrically connected to the transparent electrode 102 to control the organic light emitting diode 100. The organic electroluminescent device 200 uses the anti-reflective electrode 106 to reduce reflectivity, and uses the auxiliary electrode 108 to reduce the resistance of the anti-reflective electrode 106. Therefore, the auxiliary electrode 108 cooperates with the anti-reflective electrode 106 to conduct uniformly the electric current to injecting into the organic light emitting diode 100 easily.

The fabricating process of the organic electroluminescent device 200 can be divided into two stages. The first stage is a process of manufacturing the thin film transistor, and the second stage is a process of manufacturing the organic light emitting diode. The auxiliary electrode 108 can be formed in the first stage to connect the first conductive layer 1062 with the second conductive layer 1064, so a penetrating hole need not to be provided in the non-metal layer for the same purpose by way of adding one shadow mask in the second stage.

The fabricating process of the organic electroluminescent device 200 is described in detail. A semiconductor layer 210 is formed on the upper surface of a transparent substrate 202. The semiconductor layer 210 can be made from an amorphous silicon or a poly silicon, and have a channel 2102 and two doped areas 2101 and 2103. The doped areas 2101 and 2103 are doped heavily with p-type dopants or n-type dopants. A gate oxide layer 212 is formed on the semiconductor layer 210. A gate metal 2041 is formed on the gate oxide layer 212, and covered with a inner layer dielectric 214. Two source/drain metals 2042 and 2043 are both formed on the inner layer dielectric 214 and respectively contacts with the two doped areas 2101 and 2103 by penetrating the inner layer dielectric 214 and the gate oxide layer 212. Thus, the transistor 204 is constructed.

Before forming the organic light emitting diode 100, a passivation layer 216 can be formed on the source/drain metals 2042 and 2043, and covered by a flat layer 206.

During the process of manufacturing the organic light emitting diode 100, the transparent electrode 102 is formed on the upper surface of the flat layer 206. A part of the transparent electrode 102 penetrates the flat layer 206 and the passivation layer 216 to electrically connect to one of the source/drain metals 2042 and 2043 (taken as an example). A photo mask is provided to form the cap pattern 208 on the surface of the transparent electrode 102. The cap pattern 208, which can be made of silicon nitride, has an aperture to expose a part of the transparent electrode 102, so as to define a transparent region 220. The unexposed part of the transparent electrode 102 is defined as a non-transparent region 230. The auxiliary electrode 108 is formed on the cap pattern 208 in the non-transparent region 230. The organic emission layer 104 is formed on the cap pattern 208. Note that the thickness of the organic emission layer 104 should be less than the height of the auxiliary electrode 108.

After that, the anti-reflective electrode 106 is formed on the organic emission layer 104, the fabricating steps are described as follows: forming the first conductive layer 1062 on the organic emission layer 104 to contact with the auxiliary electrode 108, and let the total thickness of the first conductive layer 1062 and the organic emission layer 104 be less than the height of the auxiliary electrode 108; next, forming the non-metal layer 1064 on the first conductive layer 1062, and let the total thickness of the non-metal layer 1064, the first conductive layer 1062 and the organic emission layer 104 be less than the height of the auxiliary 108; and then forming the second conductive layer 1066 on the non-metal layer 1064 to contact with the auxiliary electrode 108. Thus, the auxiliary electrode 108 can contact the first conductive layer 1062 with and the second conductive layer 1066 to aid in electric current to flow into it.

Figure 3:
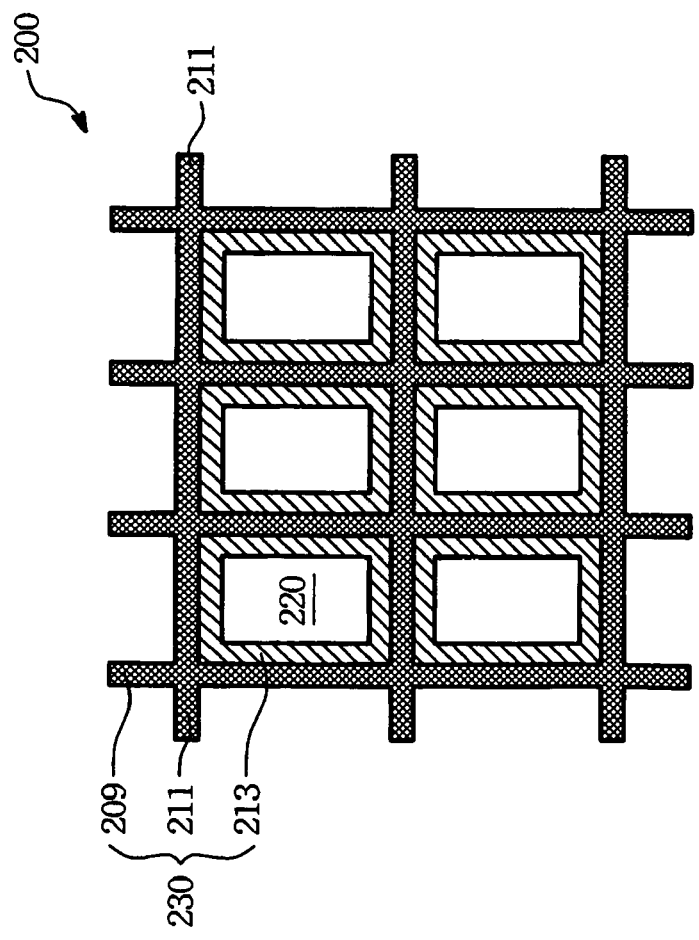
FIG. 3 is a top view of the organic electroluminescent device shown in FIG. 2.

Refer to FIG. 3, besides the transistor 204 and the organic light emitting diode 100, the organic electroluminescent device 200 has other circuit components such as data line 209, scan line 211, capacitor or other transistors etc. The circuit components are formed on the transparent substrate 202 to define a non-transparent region 230. As shown in FIG. 3, besides the data line 209 and the scan line 211, the non-transparent region 230 includes a layout area 213 to dispose the capacitors or the transistors. The auxiliary electrode 108 is disposed on the circuit components in the non-transparent region 230, so it does not cover the transparent region of the organic electroluminescent device 200.

Figure 4:
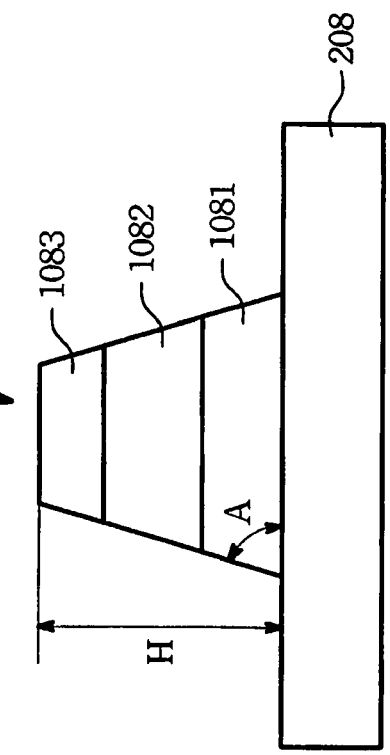
FIG. 4 is a detail structure of the auxiliary electrode.

Refer to FIG. 4 and FIG. 2, a part of the organic emission layer 104, the first conductive layer 1062, the non-metal layer 1064, and the second conductive layer 1066 are stacked on the top of the auxiliary electrode 108 since they are formed on the entire surface of the cap pattern 208. Therefore, the height or the structure of the auxiliary electrode 108 is required to prevent the second conductive layer 1066 from step coverage, further, protect the second conductive layer 1066 from breaking at the sidewall of the auxiliary electrode 108.

The auxiliary electrode 108 can be formed as an island structure or a bus-line, the sectional view shown in FIG. 4. Whichever the island structure or the bus-line is adopted, the auxiliary electrode 108 tapers from bottom to top, in order to protect the second conductive layer 1066 from breaking at the sidewall of the auxiliary electrode 108. Preferably, the height H of the auxiliary electrode 108 is larger than 1000 Å, but less than 30,000 Å. The sidewall of the auxiliary electrode 108 and the bottom plane of that form an angle ranging from about 60 degree to about 90 degree.

In addition, the auxiliary electrode 108 can be formed by stacking the sub-layers 1081, 1082 and 1083. Each of the sub-layers 1081, 1082 and 1083 can be made of Ti, Al, Nd, Ag, Mo, Cr, ITO, Ni, or their combination such as Al/Nd alloy. During forming the auxiliary electrode 108, the sub-layers 1081, 1082 and 1083 are stacked to larger than 1000 Å in height on the cap pattern 208 in the non-transparent region 230. The sub-layers 1081, 1082 and 1083 are formed by photolithography.

In above embodiments, the organic emission layer 104 may have a hole or electron transporting region. In the hole transporting region, a hole injecting layer or a hole transporting layer is selectively disposed. In the electron transporting region, a electron injecting layer or a electron transporting layer is selectively disposed. The transparent electrode 102 can be made of metals or transparent conductive materials such as ITO, IZO etc. The transparent substrate can be glass or plastic substrates. The organic light emitting diode is not limited to the bottom or top emission type. The present invention can be applied to active or passive displays.

To sum up, the organic light emitting diode of the present invention creates lower entire resistance and lower loading effect when applied to large-size panels.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:
1. An organic light emitting diode, comprising:
a transparent electrode;
an organic emission layer disposed on the transparent electrode;
an anti-reflective electrode, having a first conductive layer, a second conductive layer, and a non-metal layer disposed between the first and second conductive layers, disposed on the organic emission layer, wherein the first conductive layer is disposed between the organic emission layer and the non-metal layer; and an auxiliary electrode penetrating the non-metal layer to electrically connect the first conductive layer with the second conductive layer, wherein the height of the auxiliary electrode is larger than the total thickness of the organic emission layer, the first conductive layer and the non-metal layer.

2. The organic light emitting diode of claim 1, wherein the auxiliary electrode is island-shaped.

3. The organic light emitting diode of claim 1, wherein a sidewall and a bottom plane of the auxiliary electrode form an angle ranging from about 60 degree to about 90 degree.

4. The organic light emitting diode of claim 1, wherein the non-metal layer is a semiconductor layer or a metal oxide layer.

5. An organic electroluminescent device, comprising:
a transparent substrate;
a transparent electrode disposed on the transparent substrate;
an organic emission layer disposed on the transparent electrode;
an anti-reflective electrode, having a first conductive layer, a second conductive layer, and a non-metal layer disposed between the first and second conductive layers, disposed on the organic emission layer, wherein the first conductive layer is disposed between the organic emission layer and the non-metal layer;
an auxiliary electrode penetrating the non-metal layer to electrically connect the first conductive layer with the second conductive layer; and
a transistor electrically connected to the transparent electrode.

6. The organic electroluminescent device of claim 5, wherein the auxiliary electrode is formed as island-shaped.

7. The organic electroluminescent device of claim 6, wherein the auxiliary electrode tapers from bottom to top.

8. The organic electroluminescent device of claim 5, wherein a sidewall and a bottom plane of the auxiliary electrode form an angle ranging from about 60 degree to about 90 degree.

9. The organic electroluminescent device of claim 5, wherein the height of the auxiliary electrode is larger than the total thickness of the organic emission layer, the first conductive layer and the non-metal layer.

10. The organic electroluminescent device of claim 5, further including a flat layer formed on the transistor, wherein the auxiliary electrode and the transparent electrode are both formed on the flat layer.

11. The organic electroluminescent device of claim 5, further comprising a plurality of circuits disposed on the transparent substrate so as to define a non-transparent region, wherein the auxiliary electrode is located on the circuits in the non-transparent region.

12. A method of producing an organic electroluminescent device, comprising:
providing a transparent substrate with a transistor;
forming a transparent electrode on the transparent substrate to electrically connect to the transistor; forming a cap pattern to define a transparent region on a part of the transparent electrode and a non-transparent region on the transistor;
forming an auxiliary electrode on the cap pattern in the non-transparent region;
forming an organic emission layer on the cap pattern, so that the organic emission layer has a thickness less than the height of the auxiliary electrode;
forming a first conductive layer on the organic emission layer to contact with the auxiliary electrode, so that the total thickness of the first conductive layer and the organic emission layer is less than the height of the auxiliary electrode;
forming a non-metal layer on the first conductive layer, wherein the total thickness of the non-metal layer, the first conductive layer and the organic emission layer is less than the height of the auxiliary electrode; and
forming a second conductive layer on the non-metal layer to contact with the auxiliary electrode.

13. The method of claim 12, wherein the step of forming the auxiliary electrode comprising forming a plurality of metal layers on the cap pattern in the non-transparent region.

* * * * *